(12) United States Patent
Bugeja

(10) Patent No.: US 7,016,654 B1
(45) Date of Patent: Mar. 21, 2006

(54) PROGRAMMABLE POWER-EFFICIENT FRONT END FOR WIRED AND WIRELESS COMMUNICATION

(75) Inventor: Alex Bugeja, Acton, MA (US)

(73) Assignee: Engim, Inc., Acton, MA (US)

( * ) Notice: Subject to any disclaimer, the term of this patent is extended or adjusted under 35 U.S.C. 154(b) by 452 days.

(21) Appl. No.: 10/135,776

(22) Filed: Apr. 30, 2002

Related U.S. Application Data

(60) Provisional application No. 60/287,367, filed on Apr. 30, 2001.

(51) Int. Cl.
H04B 1/38 (2006.01)

(52) U.S. Cl. .................. 455/73; 455/127.1; 455/20; 455/343.1; 455/343.2

(58) Field of Classification Search ............. 455/20, 455/574, 522, 127.1, 73, 550.1, 552, 343.1, 455/343.2; 370/320, 336, 347
See application file for complete search history.

(56) References Cited

U.S. PATENT DOCUMENTS

| | | | |
|---|---|---|---|
| 6,137,431 A | 10/2000 | Lee et al. | |
| 6,198,417 B1 | 3/2001 | Paul | |
| 6,271,784 B1 | 8/2001 | Lynn et al. | |
| 2004/0137852 A1* | 7/2004 | Shi et al. | 455/73 |
| 2004/0147277 A1* | 7/2004 | Kaewell et al. | 455/522 |
| 2004/0166804 A1* | 8/2004 | Moloudi et al. | 455/20 |

* cited by examiner

Primary Examiner—Sonny Trinh
Assistant Examiner—Phuoc Doan
(74) Attorney, Agent, or Firm—Gauthier & Connors LLP

(57) ABSTRACT

A front-end used for processing communication signals in a received path including an antenna cable segment that receives the communication signals. A RF segment provides mixing and filtering of the received signals, the RF segment outputs a first set of signals. An analog baseband segment performs low pass filtering and digitizes the first set of signals in order to input a second set of signals for further processing. The RF segment and the analog baseband segment includes a selective set of components that are power programmable, such that the power consumption of the selective set of components are controlled by bias currents delivered to each of the selective components. In another embodiment, the components of a transmit path are also power programmable via bias current. In another embodiment, the ADCs and DACs of a receive and transmit paths are power programmable via bias current and reconfigurable blocks of ADC and DAC cores.

30 Claims, 13 Drawing Sheets

PROGRAMMABLE POWER-EFFICIENT FRONT END FOR WIRED AND WIRELESS COMMUNICATION

PRIORITY INFORMATION

This application claims priority from provisional application Ser. No. 60/287,367 filed Apr. 30, 2001.

BACKGROUND OF THE INVENTION

The invention relates to the field of wired and wireless communications, in particular, a programmable power efficient front-end for wired and wireless communications.

The commercial use of wireless and wired communications continues to be the backbone of the communications industry. The goal is developing communication devices whose size, weight, and cost are reduced, while at the same time driving the performance enhancement of these devices. Significant progress has been made in the integration and size reduction of these devices.

The use of front-ends in wired and wireless communications is standard in the art. Front-ends provide the basic structure needed for communication architectures to operate properly. Front-ends include all the necessary components in processing signals that are either received or transmitted from a communication device. Most front-ends are integrated circuits that are included in communication devices. Also, front ends have also been reduced in size and cost.

This produces the need to properly manage the power used by such devices. Power management is an essential component in allowing communication devices to operate efficiently, without unduly burdening users. There is a need in the art for a programmable front-end architecture that can be integrated in a circuit format that is power efficient.

SUMMARY OF THE INVENTION

According to one embodiment of the invention, there is provided a front-end used for processing communication signals in a received path. The front-end includes an antenna cable segment that receives the signals. A RF segment provides mixing and filtering of the received signals in order to output a first set of signals. An analog baseband segment performs low pass filtering and digitizes the first set of signals in order to output a second set of signals for further processing. The RF segment and the analog baseband segment include a selective number of components that are power programmable, such that the power consumption of the selective number of components is scaled commensurate with bandwidth being utilized.

In another embodiment of the invention, there is provided a front-end used for processing communication signals in a transmit path. The front-end includes an analog baseband that receives modulated signals and performs digital to analog conversion and low pass filtering of the modulated signals in order to output a first set of signals. A RF segment performs mixing and power amplification of the first set of signals in order to output a second set of signals. An antenna cable segment prepares the second of signals for transmission. The RF segment and the analog baseband segment include a selective number of components that are power programmable, such that the power consumption is scaled commensurate with bandwidth being utilized.

DETAILED DESCRIPTION OF THE INVENTION

Figure 1A:
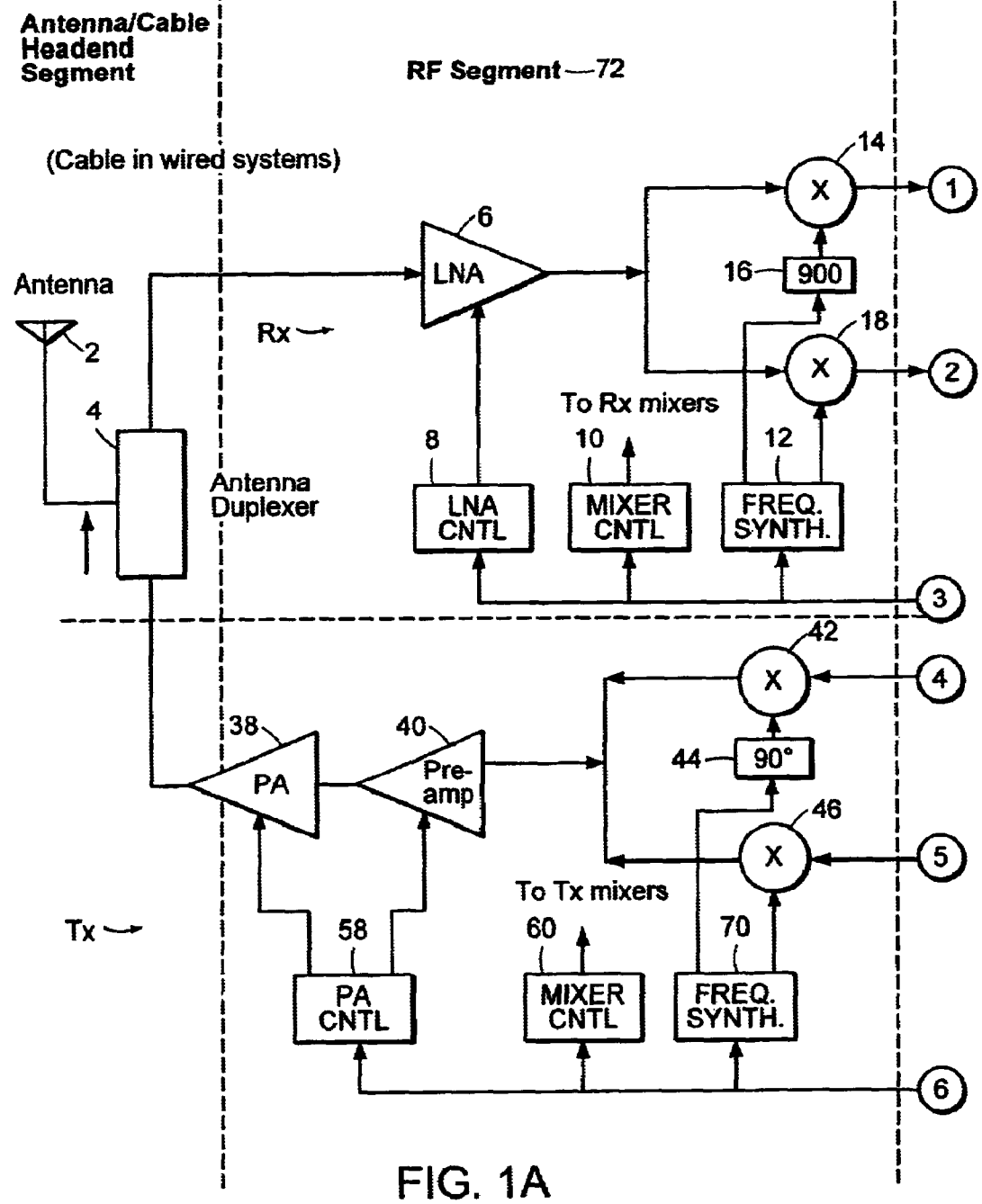
FIG. 1 is a schematic block diagram of a communication front-end architecture.
Figure 1B:
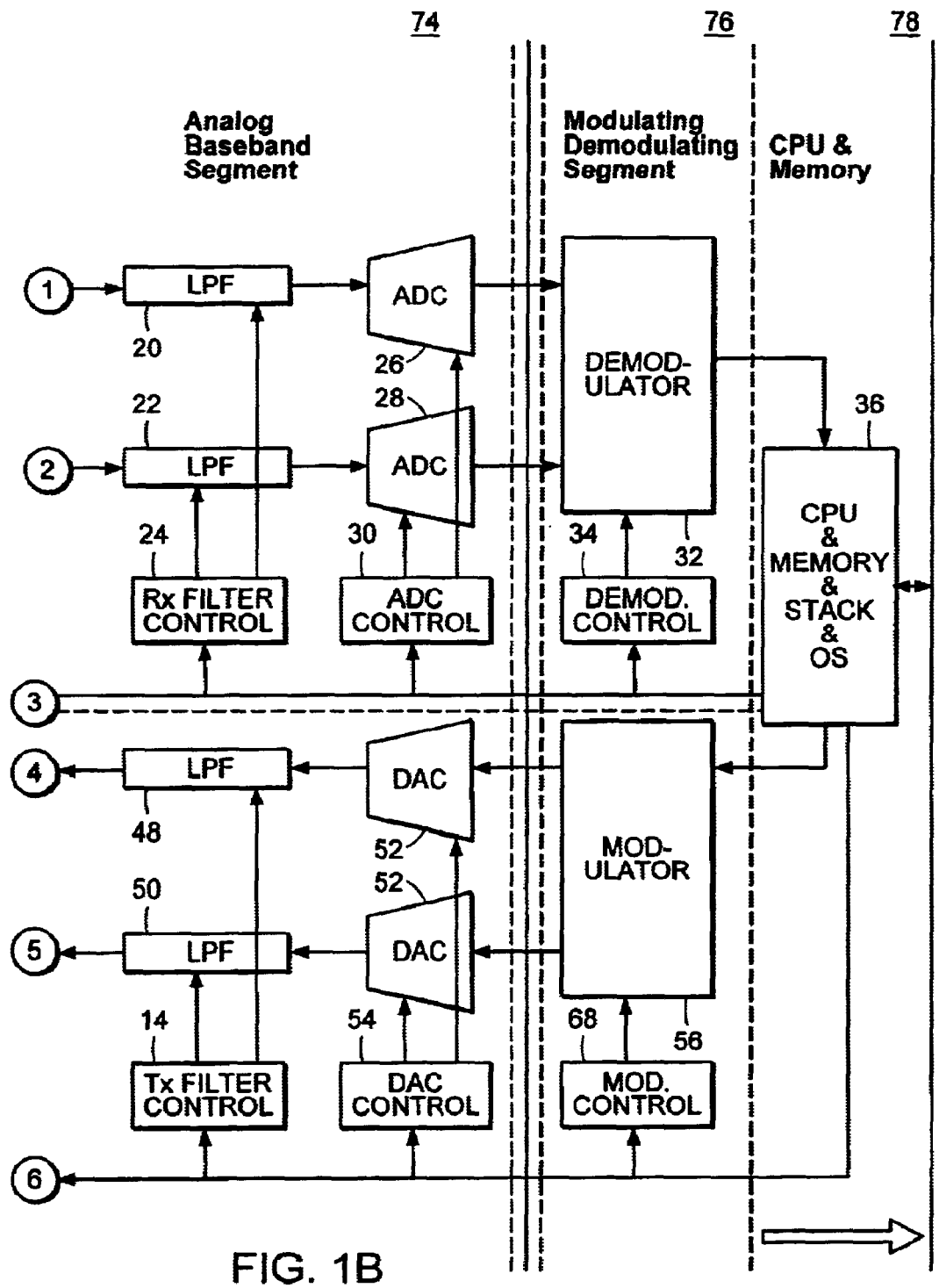

FIG. 1 is a schematic block diagram of an exemplary embodiment of a communication front-end architecture 1. The communication front-end architecture 1 includes an antenna cable segment (ACS) 70, a RF segment 72, an analog baseband segment 74, a demodulating/modulating segment (D/M) segment 76, and a CPU and memory segment 78. In this embodiment, the communication front-end architecture 1 is for wireless communications. However, the communication front-end architecture 1 can also be used for wired communications without requiring significant changes. The communication front-end architecture 1 is divided into two signal processing paths $R_x$ and $T_x$. The $R_x$ path provides a path for processing incoming signals from the ACS 70, and the $T_x$ path provides a path for processing of outgoing signals to the ACS 70. The RF segment 72, analog baseband segment 74, and D/M 76 include separate components associated with the $R_x$ and $T_x$ paths. The RF segment 72, analog baseband segment 74, and D/M segment 76 provide the necessary functionality in processing incoming and outgoing signals.

The ACS 72 includes an antenna component 2 and an antenna duplexer 4. The antenna duplexer 4 includes time and frequency protocols. These protocols or protocol combinations can require time duplexing while others may require frequency duplexing. Simultaneous operation entails the possibility of collisions and conflicts between resources in the communication front-end architecture 1. For example, an end-to-end link using a protocol A can require transmissions on a frequency band X at the same time another end-to-end link using a protocol B may require reception on a frequency band Y. Frequency duplexing is required to meet the simultaneous operation conditions. However, they cause errors to be received, as well as transmitted if the transmitted signal leaks to the antenna component 2 from the $R_x$ path. Such conflicts can be mediated at higher layers. A bandpass-filter responsible for broadband selection can be present outside the front-end, usually as a surface acoustic wave device.

In the case of wired systems, the antenna duplexer 4 and the bandpass filter can be replaced by a low pass filter. In the particular case of wireless, diversity arguments apply in the usual way as those skilled in the art already recognize.

The antenna component 2 can employ two-phase separated antennas rather than one, and the strongest incoming signal is chosen between the two by means of a switch. The unused antenna can be used as a transmit antenna during this time. It is also possible for the antenna component 2 to use separate transmit and receive antennas if the feedthrough from a transmit and receive antennas becomes a problem. This maximizes the isolation between the $R_x$ and $T_x$ paths and allows for simultaneous transmission and reception, since the receive signal is usually much smaller than the transmitted signal.

The RF segment 72 includes components in both the $R_x$ and $T_x$ paths. In the $R_x$ path, the analog baseband segment 74 includes a LNA 6, a first mixer 14, a first 90-degree phase shift module 16, a second mixer 18, LNA power module 8, a first mixer control module 10, and a first frequency synthesizer module 12. The RF segment 72 includes in the $T_x$ path a power amplifier 38, a pre-amplifier 40, third mixer 42, a second 90 degree phase shift module 44, a fourth mixer 46, a power amplifier control module 58, a second mixer control module 60, and a second frequency synthesizer module.

The LNA 6 input is coupled to the output of the antenna duplexer 4, and receives as input a programmable bias current from the LNA control module 8. The LNA 6 provides low noise amplification associated with a signal received from the ACS 70. The output of the LNA 6 is coupled to the inputs of the first 14 and second mixer 18. The first mixer 14 receives as input the output of the first 90-degree phase shift module 16 and a programmable bias current from the first mixer control module 10. The first 90-degree phase shift module 16 introduces a phase shift of 90 degrees to the signal indicative of the output of the LNA 6, and receives as input a frequency from the first frequency synthesizer 12. The first mixer 14 outputs its results to the analog baseband segment 74. The second mixer 18 receives as input the output of the LNA 6, the frequency from the first frequency synthesizer 12, and a programmable bias current from the first mixer control module 10. The second mixer 18 outputs its results to the analog baseband segment 74.

The third mixer 42 receives as input a signal from the analog baseband segment 74, a 90-degree phase shift from the second 90-degree phase shift module 44, and a programmable bias current from the second mixer control module 60. The second 90-degree phase shift module receives as input a frequency from the second frequency synthesizer module 62. The fourth mixer 46 receives as input a signal from the analog baseband segment 74, the frequency from the second frequency synthesizer module 62, and a programmable bias current from the second mixer control module 60. The third 42 and fourth 46 mixers perform mixing by incorporating a 90-degree phase shift to the frequency of their respective inputs.

The outputs of the third 42 and fourth 46 mixers are combined and sent to the pre-amplifier 40 as input. The pre-amplifier 40 also receives as input programmable bias current from the control amplifier control module 58, and outputs a signal that includes a gain associated with its input. In this case, the input is the combined signal of the outputs indicative of the third 42 and fourth 46 mixers.

The power amplifier 38 receives as input the output of the pre-amplifier 40 and the programmable bias current from the power amplifier control module 58, and outputs a signal, which is indicative of the output of the pre-amplifier 40 with an associated power gain for transmission. The power amplifier 38 provides its output to the antenna duplexer 4 for transmission.

The power amplifier 38 can be implemented off-chip if the front-end architecture 1 is implemented as an integrated chip. If the power amplifier 38 is implemented off-chip, the pre-amplifier 38 is included on-chip, although this depends on the protocols being transmitted and the power levels required. The power control of the power amplifier 38 can generally be associated with any one protocol, as can the power control for the LNA 6 and mixers 14, 16, 42, and 46. Therefore, LNA control module 8, first 10 and second 60 mixer control modules, and power amplifier control module 58 include the necessary power control information for adjusting and managing power levels associated with their respective components, and their respective components are power programmable via a programmable bias current. The modules 8, 10, 60, and 58 provide to their respective components the programmable bias current.

The position of the bias current sets the power consumption of the components in the RF segment. The control modules 8, 10, 60, and 58 perform power consumption scaling with a desired bandwidth and spectral efficiency, and provide to their respective components sufficiently high linearity and dynamic range.

Frequency tuning is provided by way of the first 12 and second 62 frequency synthesizer module. The frequency synthesizer modules set the tuning of the filters in the mixers 14, 18, 44, and 46 as their tuned loads.

The analog baseband segment 74 includes in the $R_x$ path a first low pass filter (LPF) 20, a second LPF 22, a first analog to digital converter (ADC) 26, a second ADC 28, a first LPF control module 24, and an ADC control module 30. The first LPF 20 receives as input the output of the first mixer 14 and LPF control information from the first LPF control module 24, and filters out high frequency signals from the output of the first mixer 14. The first LPF 20 provides its output to the first ADC 26. The second LPF 22 receives as input the output of the second mixer 18 and LPF control information from the LPF control module 24 to perform the filtering operation, and filters out high frequency signals from the output of the mixer 18. The second LPF 22 provides its output to the second ADC 28. Other $R_x$ analog baseband architectures can be implemented with the invention, such as the use of a single ADC, as those skilled in the art will recognize.

The signal provided to the LNA 6 by the antenna duplexer 4 is analog. Therefore, the processing performed in the RF segment 72 is analog and the signals received to analog baseband are also analog. The first ADC 26 receives as input the output of the first LPF 20 and programmable bias current from the first ADC control module 30. The ADC provides a digitized signal of the output of the LPF 20. The first ADC 26 provides its output to the D/M segment 76. The second ADC 28 receives as input the output of the LPF 22 and the programmable bias current from the first ADC control module 30, and digitizes the output of the second LPF 22. The second ADC 28 also provides its output to the D/M segment 76.

The analog baseband segment 74 also includes in the $T_x$ path a first DAC 52, a second DAC 54, a third LPF 48, a fourth LPF 50, a DAC control module, and a second LPF control 64. The first DAC 52 receives as input a digitized signal from the D/M 76 and programmable bias current from the DAC control module 66, and converts the digitized signal into analog. The first DAC 52 provides its output to the third LPF 48. The second DAC 54 receives as input a separate digitized signal from the D/M segment 76 and programmable bias current from the DAC control module 66, and converts the digitized signal into analog. The second DAC 54 provides its output to the fourth LPF 50. Other $T_x$ analog baseband architectures can be implemented with the invention, such as the use of a single DAC, as those skilled in the art will recognize.

The third LPF 48 receives as input the output of the first DAC 52 and the LPF control information from the second LPF control module 64, and performs low pass filtering on the output of the third DAC 52, thus removing high frequency noise. The third LPF 48 provides its output to the third mixer 42 in the RF segment 72. The fourth LPF 50 receives as input the output of the second DAC 54 and LPF control information from the second LPF control module 64. The second LPF 50 performs low pass filtering on the output of fourth DAC 54, and provides its output to the fourth mixer 46 of the RF segment 72.

The first 52 and second 54 DACs produce signals with images at the sampling frequency, which can be problematic if these images are passed through the RF segment 72. The third 48 and fourth 50 LPFs lowers the amount of spectral images transmitted by the first 52 and second 54 DACs. If insufficient filtering is performed, some of these images can be radiated out the antenna component 2 and would violate allowed spectral transmission guidelines.

The first 24 and second 64 LPF control modules provide their respective devices LPF control information. The LPF control information includes information regarding the cut-off frequency for low pass filtering and provides the necessary programmable bias current. The first 24 and second 64 LPF control module manages the power consumption by providing the proper programmable bias current to their respective devices.

The first 26 and second 28 ADCs and the first 52 and second 54 DACs are power programmable via fine and coarse grain granularity in power shutoff control of reconfigurable circuit blocks, as well as via a programmable bias current. Each of the ADCs and DACs include a selective of number of cores, which are associated with reconfigured circuit blocks. One of the ways to control power consumptions is by shutting on or off a certain number of the reconfigured circuit blocks. ADCs also include a selective number of stages that can be associated with an ADC core. The invention allows shutting on and off of these stages of an ADC core, thus allowing a more finer power programmability of an ADC. The ADCs and DACs exhibit sufficient dynamic range so as to handle both a wide range of protocols as well as handle multiple channels. The ADC control module 30 and DAC control module 66 provide the functionality which allows for power programmability by controlling the reconfigured blocks of their respective devices to produce fine and coarse grain granularity in power shutoff control. The ADC control module 30 and DAC control module 66 also adjust and manage the bias currents received to their respective devices.

The first 20 and second 22 LPFs are used for anti-aliasing. The third 48 and fourth 50 LPFs are used for high frequency rejection out of the Nyquist band of a DAC output buffer, to be discussed more below. The requirements on the first 20 and second 22 LPFs, in particular the roll-off requirement, can be relaxed by increasing the input bandwidth of the first 26 and second 28 ADCs. The requirement on the third 48 and fourth 50 LPFs is that the roll-off requirement can be relaxed by interpolating by twice or more the signals in the first 52 and second 54 DACs by employing a sampling rate twice as high as the Nyquist frequency of the signal transmitted.

The D/M segment 76 includes in the $R_x$ path a demodulator module 32. The demodulator module 32 receives as input the outputs of the first 26 and second ADC 28, and also receives as input demodulation control information current provided by the demodulator control module 34. The demodulator module 32 demodulates the signals from the outputs of the first 26 and second 28 ADC, and further performs the computationally intensive task of demodulating the outputs the first 26 and second 28 ADCs. The demodulator module 32 provides its output to the CPU and Memory segment 78.

The D/M segment 76 also includes in the $T_x$ path a modulator module 50. The modulator module 50 receives a signal from the CPU and memory segment 78, and also receives modulation control information from the modulator control module 68. The modulator module 50 performs the computationally intensive task of modulating the signal received from the CPU and Memory segment 78, and outputs two modulated signals. One of the signals is provided to the first DAC 52 and a second is provided to the second DAC 54.

The modulator control module 66 and demodulator control module 34 provide the modulation and demodulation control information to their respective devices to manage properly the demodulation and modulation of their respective signals. The demodulator module 32 and modulator module 50 can include further processing components, such as a processor, to perform their respective tasks.

The CPU and Memory segment 78 includes a CPU and memory module 36. The CPU and memory module 36 is responsible for controlling the entire system. The CPU and memory module 36 manage software stacks for the protocols which must be handled, and control the communications with higher communication layers, such as layer 3 in the OSI model through an interface or set of interfaces on the backend. In particular, with most of the components being programmable in the RF segment 72, it is possible to write software programs which retune the communication front-end 1 and change it capabilities in response to changing communication demands or wireless/wired conditions.

For example, the transmit/receive bandwidth could be scaled with the power available. By providing commands to the various control modules in the RF segment 72 and analog baseband segment 74, it can adjust their bias currents for efficient power consumption. Interfaces are provided such that the CPU and Memory module 38 can communicate with the various control modules in the communication front-end 1. The interfaces are referred to as "analog applications programming interfaces (APIs)" and are visible to software programmers as a set of instructions, which alter all the programmable characteristics of the various control modules in the communication front end 1, especially those control modules in the RF segment 72 and analog baseband segment 74.

The CPU and memory module 36 provides commands to the control modules in the communication front-end 1 through two control buses 80 and 82. The control bus 80 is reserved for issuing commands to control modules in the $R_x$ path. The control bus 82 is reserved for issuing commands to control modules in the $T_x$ path. Also, all the control modules in the communication front end 1 include the appropriate interfaces to properly process the commands, perform their required tasks, and communicate with the CPU and memory module 36.

The remaining functions of the CPU and Memory module 36 are provided by additional software, such as a multi-threaded operating system to be used to run several threads of a stack simultaneously if multiple channels are being used through the RF segment 72 and analog baseband segment 74.

Figure 2:
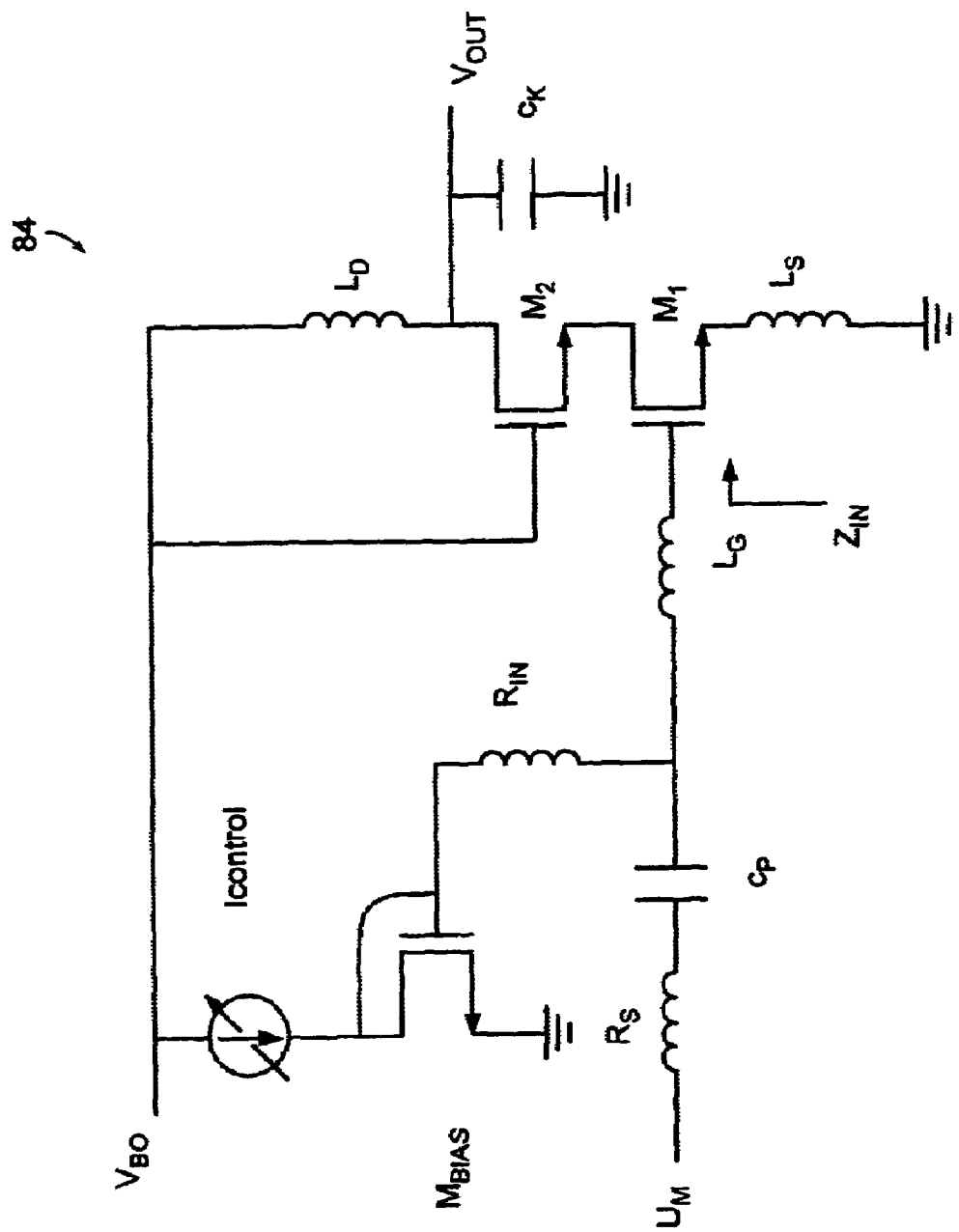
FIG. 2 is a circuit diagram of a low noise amplifier (LNA) with programmable bias current.

FIG. 2 is a circuit diagram of a LNA 84 with programmable bias current. In this embodiment, the LNA 84 uses MOSFETs, however, a similar circuit with bipolar devices can be constructed. Other types LNAs that utilize programmable bias currents can be used with this invention.

LNA 84 includes a current source $I_{CNTRL}$, which is connected to a voltage source $V_{DD}$ and a source of a MOSFET $M_{BIAS}$. The current source $I_{CNTRL}$ is the programmable bias current received. The gate and source of the MOSFET $M_{BIAS}$ are mutually connected. The drain of the MOSFET $M_{BIAS}$ is connected to ground, thus making the MOSFET $M_{BIAS}$ a grounded MOSFET. Resistor Rs is connected at one end to a voltage input Vin and the other to a first end of capacitor $C_B$. The second end of the capacitor is connected to a first end of inductor $L_G$. The second end of $L_G$ is connected to the gate of a MOSFET $M_1$. The drain of the MOSFET $M_1$ is connected to the first end of an inductor $L_s$. The source of the MOSFET $M_1$ is connected to the drain of a MOSFET $M_2$. The second end of the inductor $L_s$ is connected to ground.

The gate of the MOSFET $M_2$ is connected to the voltage source $V_{DD}$, and the source of the MOSFET $M_2$ is connected the second end of an inductor $L_D$ which is also connected to an output voltage $V_{OUT}$. The first end of the inductor $L_D$ is connected to the voltage source $V_{DD}$. The first end of a capacitor $C_L$ is connected to the output voltage $V_{out}$, and the second end of the capacitor $C_L$ is connected to ground. The first end of resistor $R_{BIAS}$ is connected to the gate of MOSFET $M_{BIAS}$ and the second end is connected to the second end of the capacitor $C_B$.

The input impedance Zin is defined as $$Z_{in} = sL_s + \frac{1}{sC_{gs}} + \frac{gm}{C_{gs}}L_s \qquad \text{Eq. 1}$$

where gm is the transconductance of the MOSFET $M_1$ and $C_{gs}$ is the load capacitance for MOSFET $M_1$. The output bandwidth is defined as $$\frac{g_m}{C_L}. \qquad \text{Eq. 2}$$

The output and input resonances may be used to create additional bandpass filtering or to replace the off-chip bandpass filter entirely.

Different considerations apply to power variation in this embodiment. The center frequencies remain unchanged in this embodiment, since the dominant capacitance $C_{gs}$ is independent of bias. However, it is not possible to retain constant input impedance and the input match. Similarly, the bandwidths go down with decreasing bias. Both of these characteristics are again consistent with the need for lower performance with lower bias currents, although it can be seen that the exact performance derived from each bias current level may differ from the bipolar case due to the different behavior.

Varying the bias current in the bipolar case changes the load capacitances in proportion to the transconductances, since both are proportional to the bias current. Therefore, bandwidths are not changed. The input impedance $Z_{in}$ retains the same real component part so input matching is retained. The center frequencies of the resonant input and output circuits change, however, owing to the varying of the capacitance loads but maintaining the inductance terms constant. Therefore, the bandwidths should be sufficiently large so as to ensure that at no point over the current variation range does the shifting center frequency become a problem. This may require that the off-chip bandpass filter limit the actual signal and noise bandwidths, for example. However, the bandwidth required at lower currents is generally reduced and is less of a problem.

Capacitor tuning is a possibility with processes that include variable capacitors in their suite of passive components. The bandpass filters that include load components like the LNA 84, can have their center frequency varied. In addition, notch filters can be introduced at suitable points in the circuit of the LNA 84. These filters can be useful for reducing the gain certain in parts of the spectrum, for example, an interferer may have been detected. A series connection of an inductor and varactor to ground can be introduced between MOSFETs $M_1$ and $M_2$. At the resonant frequency, the signal will be shorted to ground and the gain much reduced, thus implementing a simple notch function. The varactor is used to control the gain and resonant frequency.

Figure 3A:
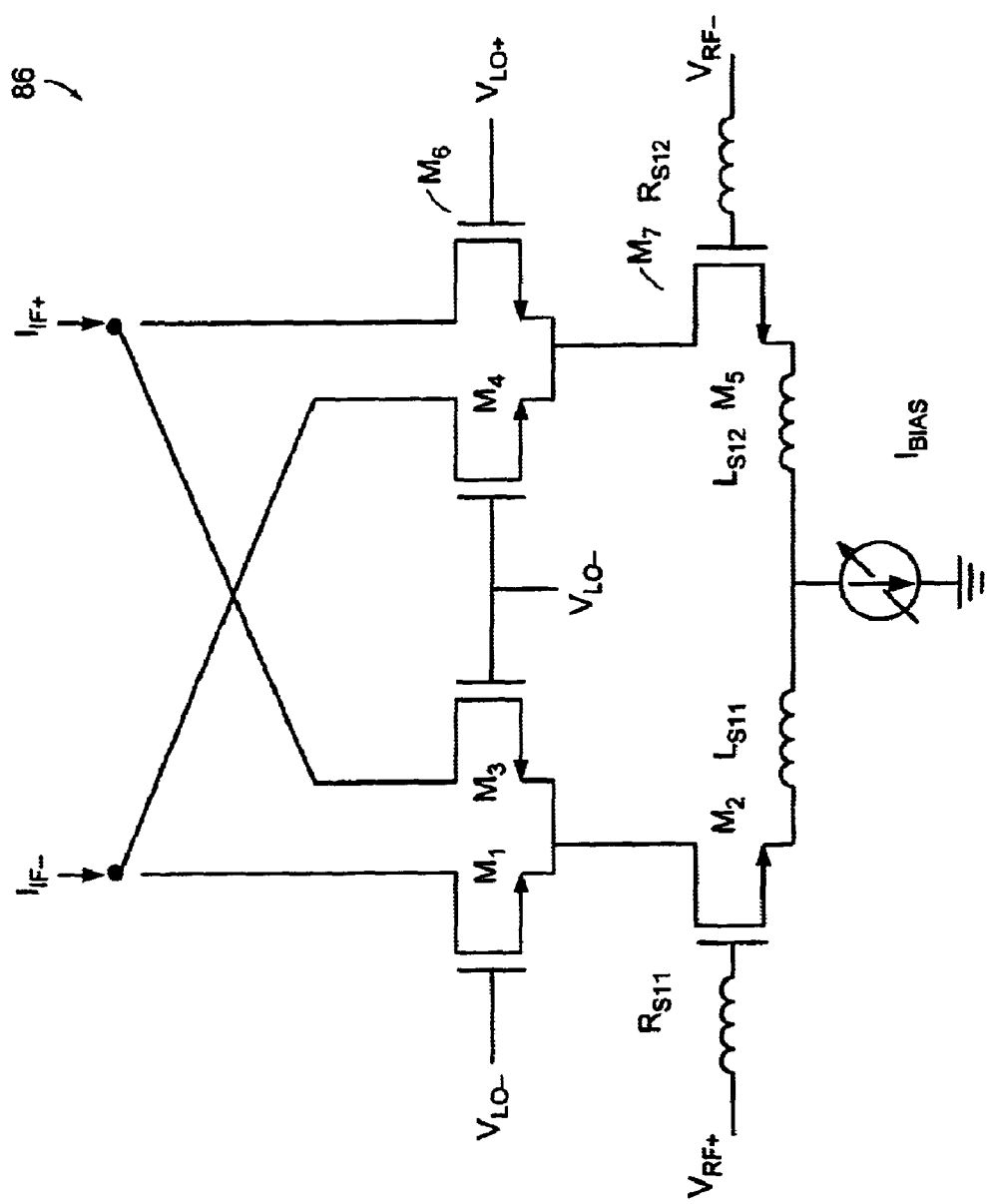
FIGS. 3A–3B are circuit diagrams of different embodiments of mixers used with the invention.
Figure 3B:
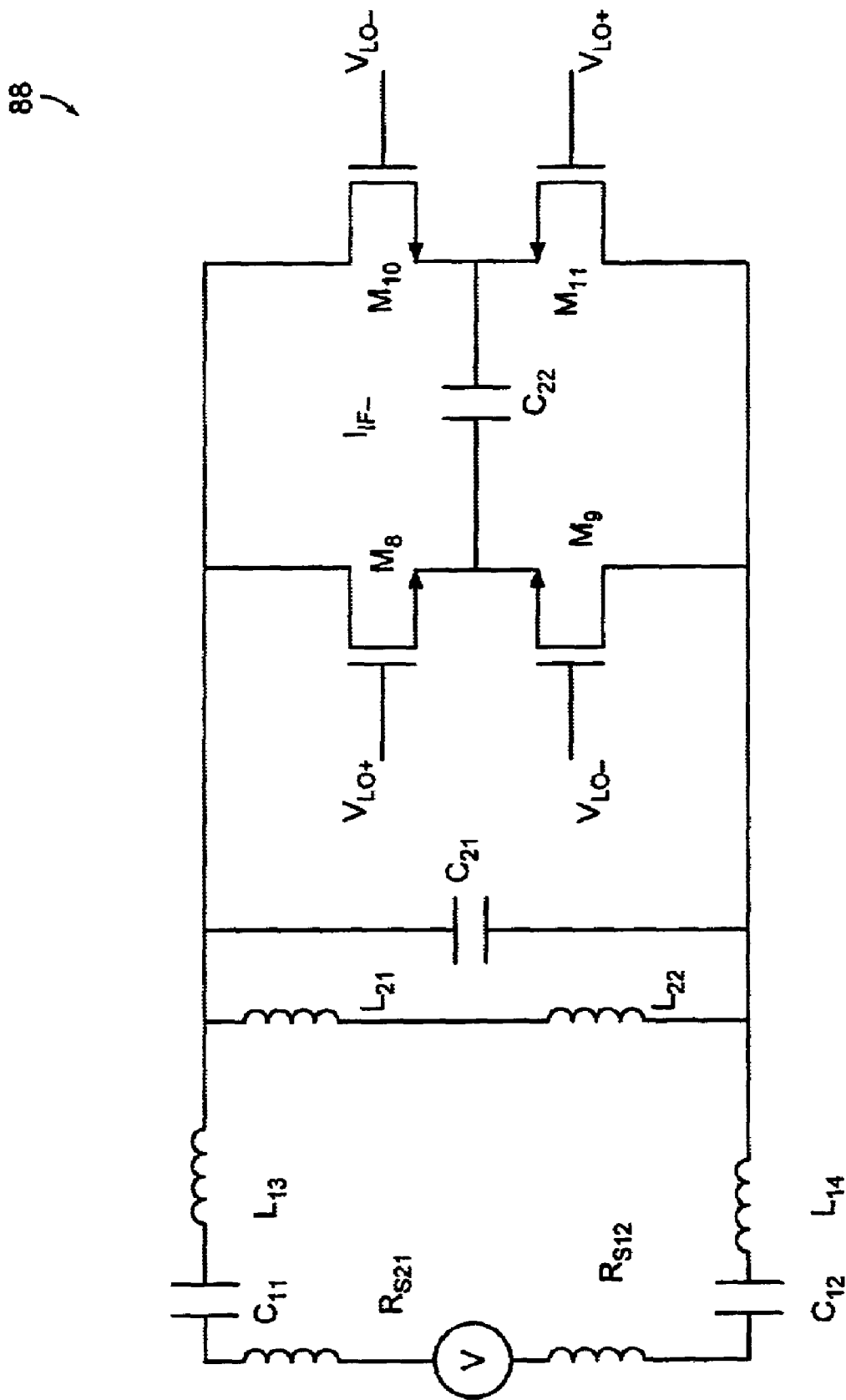

FIGS. 3A–3B are circuit diagrams of different embodiment of mixers used with invention. The mixer 86 as shown in FIG. 3A is a Gilbert type mixer. The Gilbert type mixer is suitable for both CMOS and bipolar implementations. Other alternatives to the mixers of FIGS. 3A and 3B can be used with the invention.

The mixer 86 includes a transistor M1. The source of the transistor M1 is connected to a current source $I_{IF-}$, and its gate is connected to a voltage source $V_{LO+}$. The drain of the transistor M1 is connected to the source of a transistor M2. The gate of the transistor M2 is connected to the second end of a resistor $R_{S11}$, and the drain is connected to the first end of an inductor $L_{S11}$. The first end of the resistor $R_{S11}$ is connected to an input voltage from the RF segment 72 $V_{RF}$. The source of a transistor M3 is connected to a current source $I_{IF+}$, and the drain is connected to the source of the transistor M2. The gate of the transistor M3 is connected to a voltage source $V_{LO-}$. The second end of the inductor $L_{S11}$ is connected to the first end of a current source $I_{bias}$. The second end of the current source $I_{bias}$ is connected to ground. The first end of an inductor $L_{S12}$ is connected to the first end of the current source $I_{bias}$. The second end of the inductor $L_{S12}$ is connected to the drain of a transistor M7. The gate of the transistor M7 is connected to the first end of a resistor $R_{S12}$, and the source is connected to the drains of transistors M4 and M6. The gate of the transistor M4 is connected to the voltage source $V_{LO-}$, and the source is connected to the current source $I_{IF-}$. The gate of the transistor M6 is connected to the voltage source $V_{LO+}$, and the source is connected to the current source $I_{IF+}$.

The programmable current can vary the power in the mixer 86 $I_{bias}$. The downside is that this results in varying mixer gain if passive loads are used. Active loads can be used after the mixer 86 to mitigate this effect if noise is not a problem through sufficient front-end gain being available before the mixer.

A passive CMOS mixer 88 as shown in FIG. 3B can be used as an alternative to the mixer 86. The mixer 88 includes a resistor $R_{S21}$ whose first end is connected to an input voltage source $V_{inRF}$ and second end is connected to the first end of a capacitor $C_{12}$. The second end of the capacitor $C_{12}$ is connected to the first end of an inductor $L_{14}$. The second end of the inductor $L_{14}$ is connected to the source of transistors $M_9$ and $M_{11}$. The gate of the transistor $M_9$ is connected to the voltage source $V_{LO-}$, and the drain is connected to the first end of a capacitor $C_{22}$. The gate of the transistor $M_{11}$ is connected to the voltage source $V_{LO+}$, and drain is connected to the second end of the capacitor $C_{22}$. The drain of a transistor $M_8$ is connected to the first end of the capacitor $C_{22}$, and the gate is connected to the voltage source $V_{LO+}$. The source of the transistor $M_8$ is connected to the drain of a transistor $M_{10}$. The gate of the transistor $M_{10}$ is connected to the voltage source $V_{LO-}$, and the source is connected to the second end of the capacitor $C_{22}$. The first end of a capacitor is connected to the source of the transistor $M_8$, and the second end is connected to the second end of the inductor $L_{14}$. The first end of an inductor $L_{21}$ is connected to the first end of the capacitor $C_{22}$. The second end of the inductor $L_{21}$ is connected to the first end of an inductor $L_{22}$. The second end of the inductor $L_{22}$ is connected to the second end of the inductor $L_{14}$. The front end of resistor $R_{21}$ is connected to the voltage source $V_{inRF}$, and the second end is connected to first end of a capacitor $C_{11}$. The second of the capacitor $C_{11}$ is connected to an inductor $L_{13}$, and the second is connected to the first end of the inductor $L_{21}$.

The power dissipated in the mixer 88 is primarily the dynamic power involved in charging and discharging of the four MOS transistors $M_8$, $M_9$, $M_{10}$, and $M_{11}$. Active and passive mixers can be both employed in the front-end 1, thus giving rise to different degrees of programmability depending the mixer type employed.

Figure 4A:
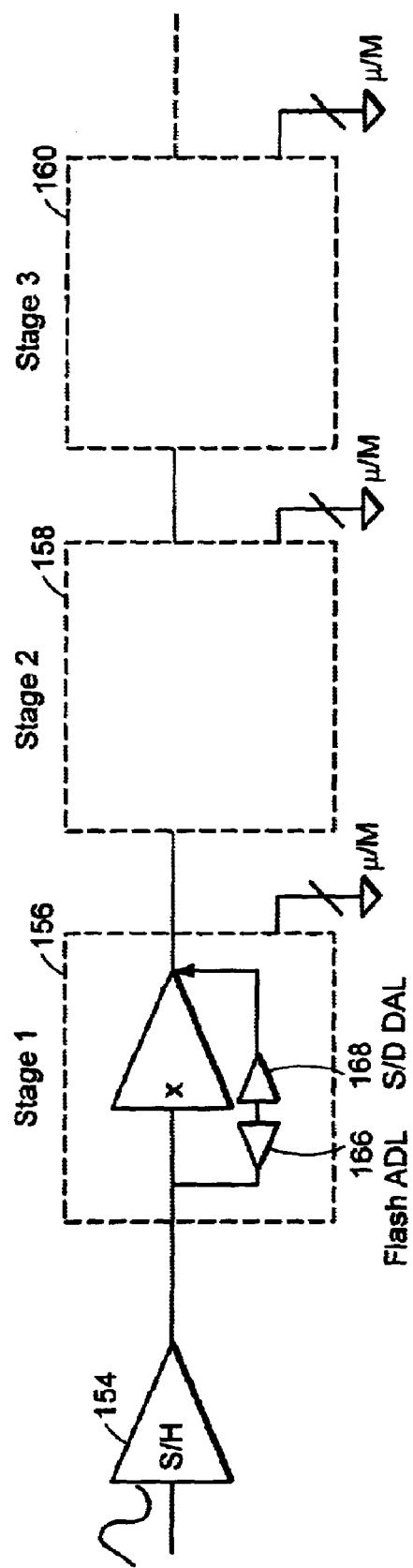
FIGS. 4A and 4B are circuit diagrams for various embodiments of an analog to digital converter (ADC)
Figure 4B:
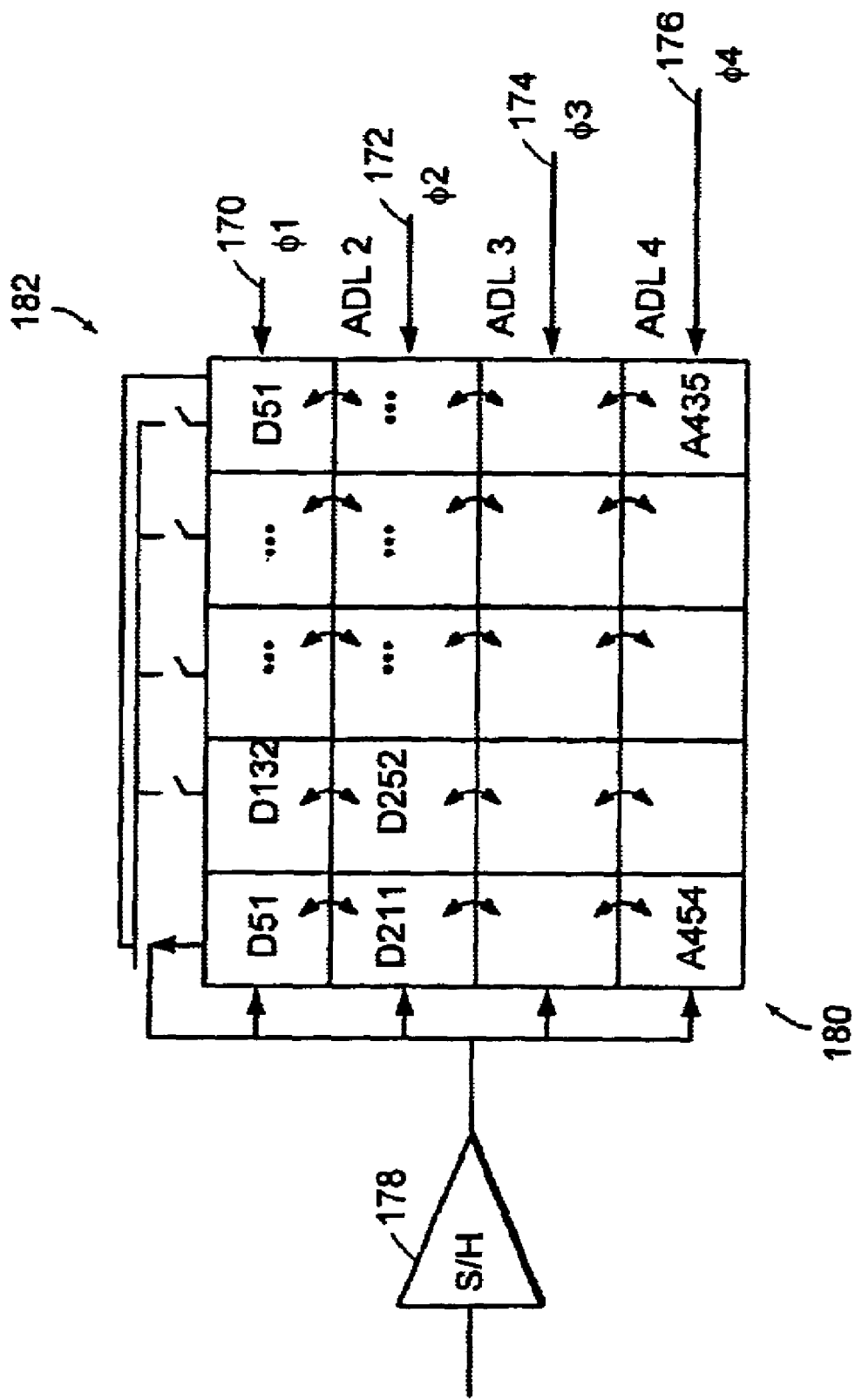

FIGS. 4A and 4B are circuit diagrams for various embodiments of an ADC. Bias currents and reconfigurable blocks control the power consumption of an ADC. These parameters can be adjusted to accommodate the specific need for power in the ADC, and control the power consumption scaling associated with a desired bandwidth and spectral efficiency. Other ADC architectures can be used, such as folding and interpolating designs.

In FIG. 4A, an ADC core 152 can be based upon a switch capacitor pipelined implementation, which may be reasonably expected to be taken up to 10–12b 50–100 MS/s. The ADC core 152 includes a stand and hold (S/H) device 154 and core stages 156, 158, and 160. Each of the core stages 154, 156, 158, and 160 includes a residue amplifier 164, an ADC flash device 166, and a S/C DAC device 168. The stages 154, 156, 158, and 160 are similar to other ADC core stages in the art. The S/H device 154 may provide additional filtering at the input of the ADC core 152, to be discussed more below. The S/H device 154 provides its output to the stage 156 of the ADC core 152. The stage 156 performs its selective processing, and provides its output as input to the stage 158. The stage 158 performs its selective processing to its input, and provides its output to the stage 160. The stage 160 performs its selective processing of its input and outputs to the next stage, if necessary. There can be more stages to the ADC core 152. That determination is based on the processing time and speed.

In FIG. 4B, four ADC basic cores 170, 172, 174, and 176 are interleaved to produce an interleaved array 180. The interleaved array 180 provides speed and power advantages over that of a regular ADC. Those skilled in the art will recognize that more or less ADC cores can be used. The aim of interleaving is to slow down circuits following a sample and hold performed by the S/H device 178, thereby saving power, which may scale nonlinearly with speed. Calibration techniques can be used at multiple levels. A first level is the use of a Dynamic Element Matching (DEM) circuit common to all ADCs, and a second level is the use of a calibration operating during idle periods equalizes and digitally compensates for the gain and offset errors of the interleaved array 180. A S/H device 178 is still required for further processing.

The bias currents of the S/H device 178 are controlled by the bias current control of the front-end 1, allowing for powering down the bandwidth and resolution of the S/H device 178 by controlling its transconductances. Powerdown of the cores 170, 172, 174, and 176 is done in several levels besides pure bias current control, however. The cores 170, 172, 174, and 176 can be switched off selectively at the core level. A fine level of control is achieved by also selectively switching off stages of each core. In particular, the first stage in each core, is the highest performing core, therefore, the cores starting from the first stage and progressing down the pipeline are powerdowned. To allow for this bypass switches 182 are provided in the switch control architecture to allow the S/H device 178 to directly drive stages other than the first in each pipelined architectures and optionally also provide feedback coupling into sigma-delta configurations. This mode, which employs oversampling to increase resolution, is useful for obtaining high resolutions at low clock speed, which cannot be obtained by pipelining.

Figure 5A:
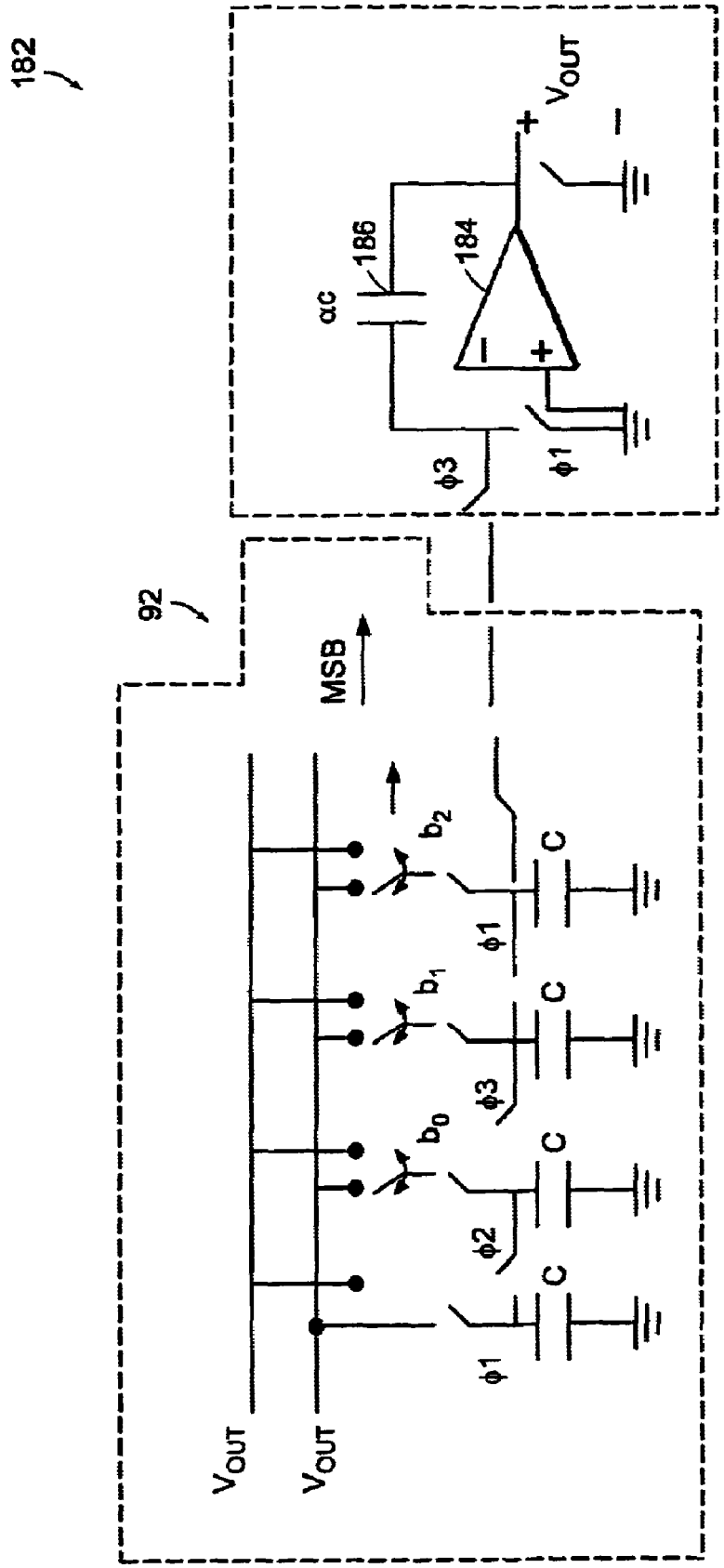
FIGS. 5A and 5B are circuit diagrams for various embodiments of a digital to analog converters (DAC)
Figure 5B:
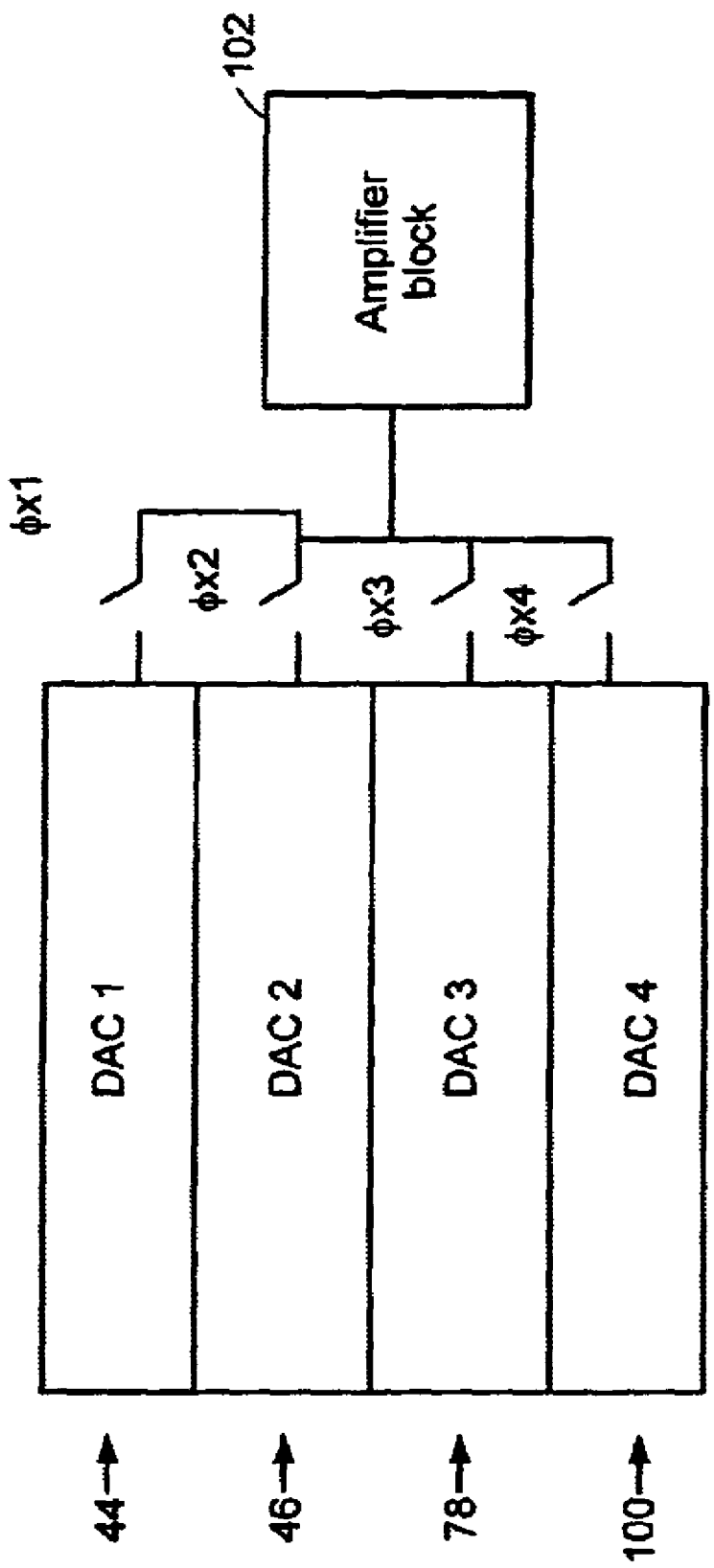

FIGS. 5A and 5B are circuit diagrams for various embodiments of a DAC. A DAC core 92 is based upon a switched capacitor pipelined implementation 92 as in FIG. 5A. This arrangement makes it possible to reach the desired interpolation for the communication front-end 1. Other architectures for a DAC core can be used, such as current source arrays. The advantage of the switch capacitor architecture is that it is more amenable to power consumption programming. Programming the power consumption of a current source array necessitates changing the output load to maintain the output voltage level, since the output voltage directly scales the output current and power consumption. Changing the output load is in general not possible given the limitations on practical switches, such as integrated MOSFET devices place on the dynamic linearity attainable. Power control is affected by bias current control, and resolution control is affected by using more or less bits.

The DAC core 92 provides at its MSB end an amplifier block 182. The amplifier block 182 includes an operational amplifier 184, varactor 186, and switches $\phi_3$ and $\phi_1$. The varactor 186 is connected to the non-inverting and output ports of the operational amplifier 182. The inverting input port of the operational amplifier is connected to ground. When the switch $\phi_1$ is closed, it connects the non-inverting port of the operational amplifier to ground, thus grounding the operational amplifier. When the switch $\phi_3$ is closed, it connects the output of the DAC core 92. The amplifier block 182 is provided to maintain non-skewing characteristics, and provide maximum dynamic linearity. As those skilled in the art will recognize, the described DAC core may also be built differentially.

FIG. 5B illustrates another embodiment where a DAC 90 includes a number of cores 94, 96, 98, and 100. The cores 94, 96, 98, and 100 can be operated in one of two modes: parallel or interleaved. In the parallel mode, the cores 94, 96, 98, and 100 operate with the same clocks. Cores 94, 96, 98, and 100 can then be powered on or off depending on the noise requirement, which is set by a kT/C consideration. This consideration is toughest for the MSB capacitors C, as shown in FIG. 5A, towards the amplifier end 104 of the pipeline. For this reason it may not be necessary to parellelize multiple stages towards the LSB end.

In the interleaved mode, the DACs are operated with interleaved clocks to boost pipeline speed rather than resolution. Power control in all modes in this embodiment is effected by bias current control, resolution control by using more less bits, and coarse DAC core power off/on.

High-speed amplifier blocks 102 and 182 with non-skewing characteristics are needed to obtain maximum dynamic linearity. Assuming the switch capacitor array 92 settles completely within the time available in each clock cycle for an associate DAC core, the high-speed amplifier 102 is the first order determinant of the dynamic linearity attainable for the DAC 90. Power control of the high-speed amplifier blocks 102 and 182 are effected using bias current control. Non-skewing characteristics can be obtained by using a telescopic/folded cascode amplifier or the like with well controlled input swings, or via a class AB operation.

Referring to FIG. 5A, the switches $\phi_1$, $\phi_2$, and $\phi_3$ are used between the corresponding capacitors C in the DAC core 92. This gives a range of possible switch-capacitor time constants. In particular, the connections between the capacitors C and the time constants between the bit switches $b_0$, $b_1$, and $b_3$ can be varied by a factor of four because of the four cores 94, 96, 98, and 100 used in DAC 90. This is useful to slowing down the overall the DAC 90 in low speed applications and conserving power, while still maintaining a large overall capacitance for the kT/C noise consideration. Slow-down of the DAC 90 is obtained by driving more than one set of capacitors C with only one set of voltage references vref1 and vref2, as shown in FIG. 5A.

Figure 6A:
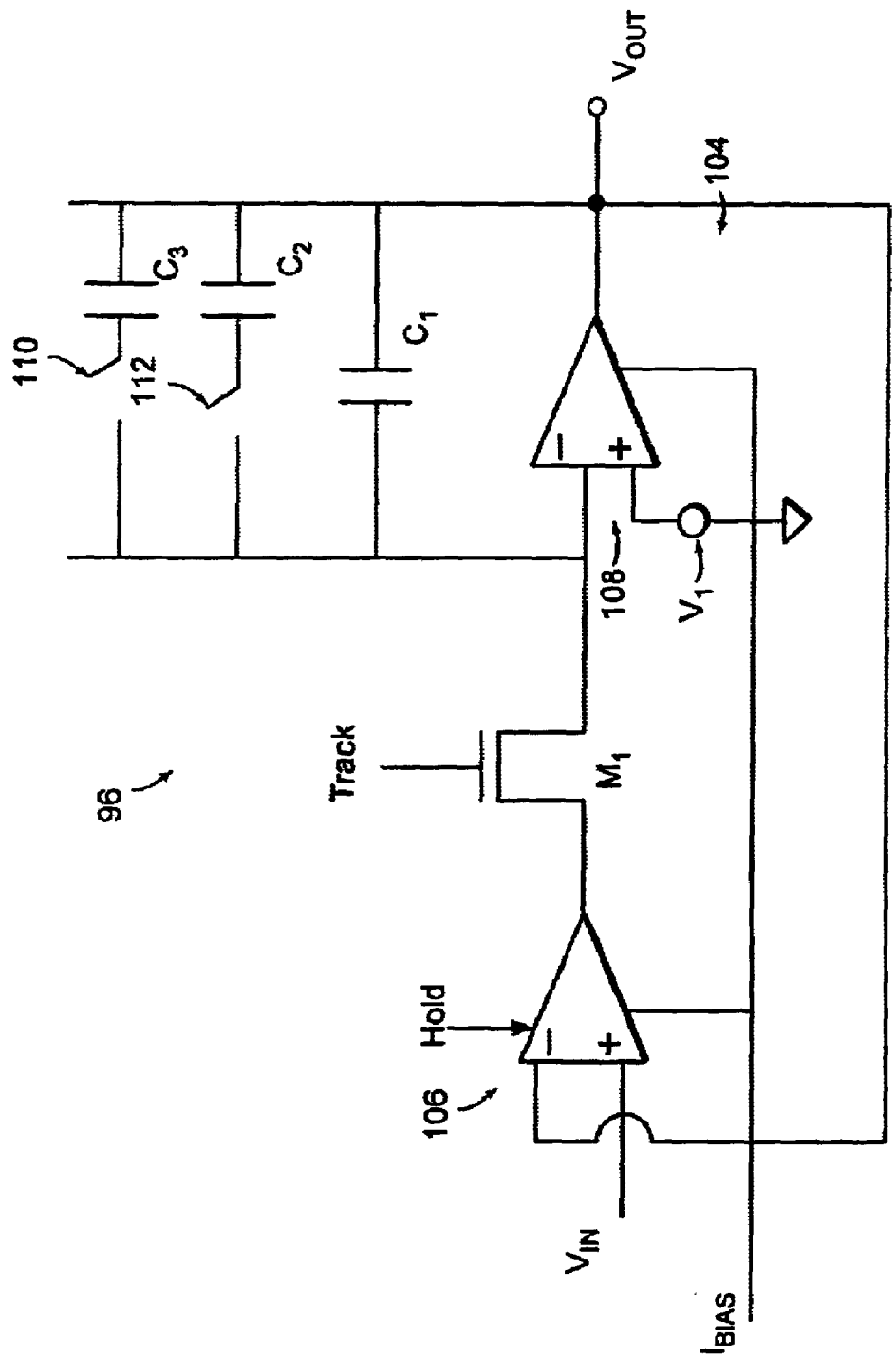
FIGS. 6A–6B are circuit diagrams for a sample and hold (S/H) device used for an ADC and a transmit amplifier used with a DAC, respectively.
Figure 6B:
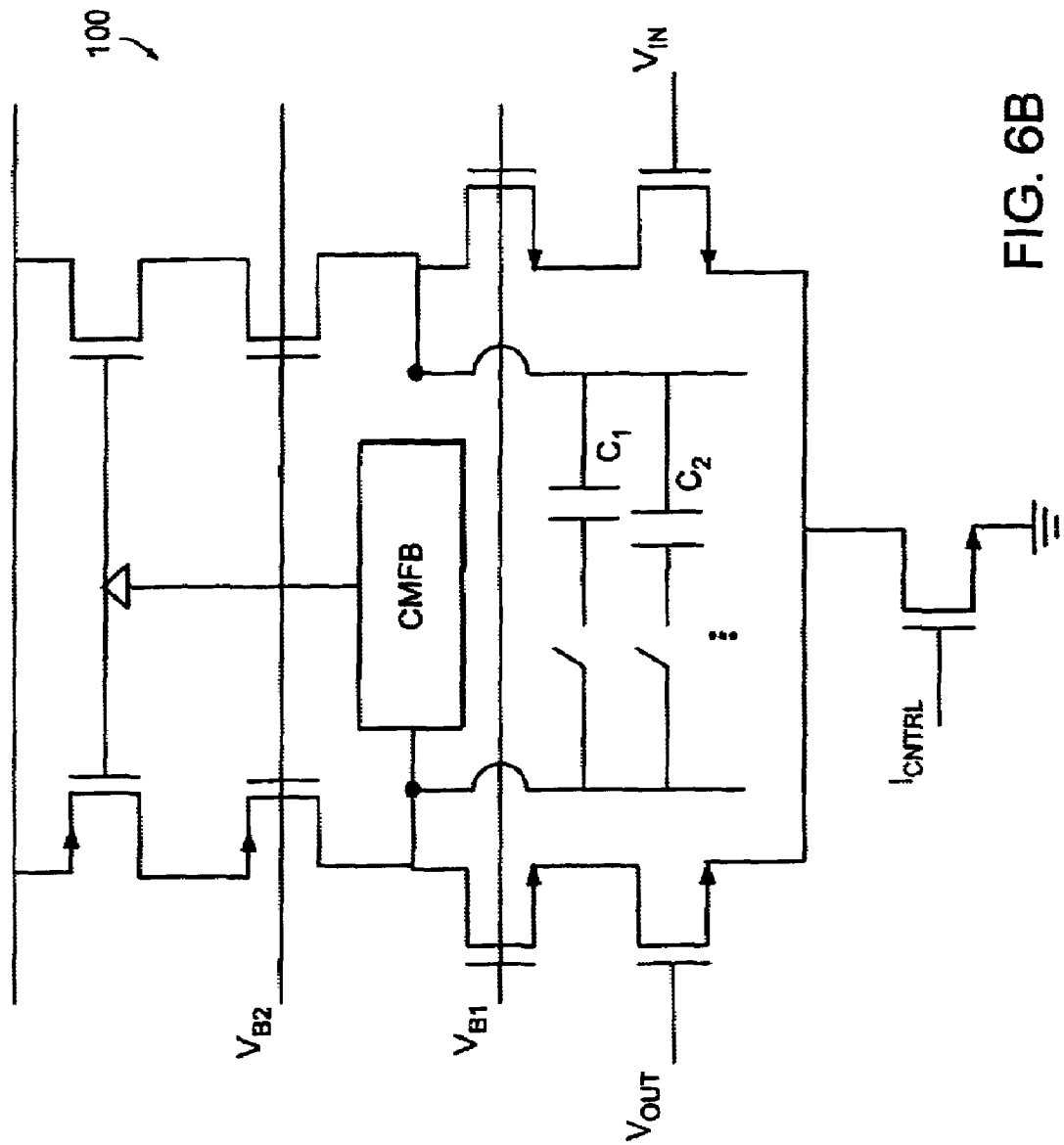

FIGS. 6A–6B are circuit diagrams for a S/H and filter device 96 for an ADC and a transmit amplifier and filter device 98 for a DAC. Low pass filters are included in the ADC input stage via the S/H and filter device 96 and the DAC output stage via the transmit and amplifier device 98, as shown in FIGS. 6A and 6B. They are necessary to remove out-of-band high frequency noise and to provide anti-aliasing, respectively. This eliminates the need for extra LPF stages in some applications.

In FIG. 6A, a closed loop S/H and filter device 96 for use at the input stage of an ADC is shown. The S/H and filter device 96 includes a variable capacitance in a feedback loop 104. The S/H 96 includes a first amplifier 106. The non-inverting input port of the first amplifier 106 is connected to an input voltage $V_{in}$ and its inverting input port is connected to an output of a second amplifier 108. The amplifier 104 also includes an input current bias port where bias current $I_{bias}$ is provided. The output of the first amplifier 106 is provided to the source of a transistor M1. The gate of the transistor M1 is connected to voltage source Track, and the drain is to the inverting input port of the second amplifier 108. The non-inverting input port of the amplifier 108 is connected to a voltage source V1. The second amplifier also include an input bias current port where bias current is provided by way of the $I_{bias}$. The second amplifier 108 is included in the feedback loop 104. The feedback loop further includes a plurality of capacitors C1, C2, and C3. Capacitor C1 is connected directly to the inverting input port and the output port of the amplifier 104. This arrangement provides a low pass filter that filters out the signal received at the inverting port. The capacitors C2 and C3 are directly connected to the output port of the second amplifier 108, and they are indirectly connected to the inverting input port of the amplifier 108 by way of switches 112 and 110. The capacitors C2 and C3 provide additional capacitance, if needed, to the feedback loop 104, once the switches 110 and 112 are closed. The transistor M1 used in this embodiment is CMOS, however other types of transistors can be used, such as bipolar transistors.

Altering the transconductance changes the bandwidth of the S/H 96 and also its power consumption. By altering the capacitances C1, C2, and C3, which are connected in the feedback arrangement 104, the bandwidth can be varied. Increasing the feedback capacitances C1, C2, and C3 can require more current to drive them, and hence an increase in power consumption.

In FIG. 6B, a telescopic differential amplifier 100 is shown for use at the output of a DAC. The differential amplifier 100 provides variable capacitance C1 and C2 for low pass filtering, as well as variable bias currents $I_{CNTRL}$. The other amplifier topologies can be used with FIG. 6B, such as folded cascade architectures. Such topologies can have some or all of their bias currents varied, and their associated compensation capacitances as well.

The arrangements in FIGS. 6A and 6B provide only simple pole rolloff and are unsuitable for sharp band edges. In the ADC case, the S/H and amplifier device 96 can be designed with excess bandwidth to allow the pole to be places further out than the sharp edge, to guarantee minimal aliasing. The correct frequency behavior can then be obtained in more accurate analog digital filters in a channelizer bank. In the DAC case, the requirements on the transmit amplifier and filter 98 can be relaxed by interpolation of the input data to the DAC.

Figure 7A:
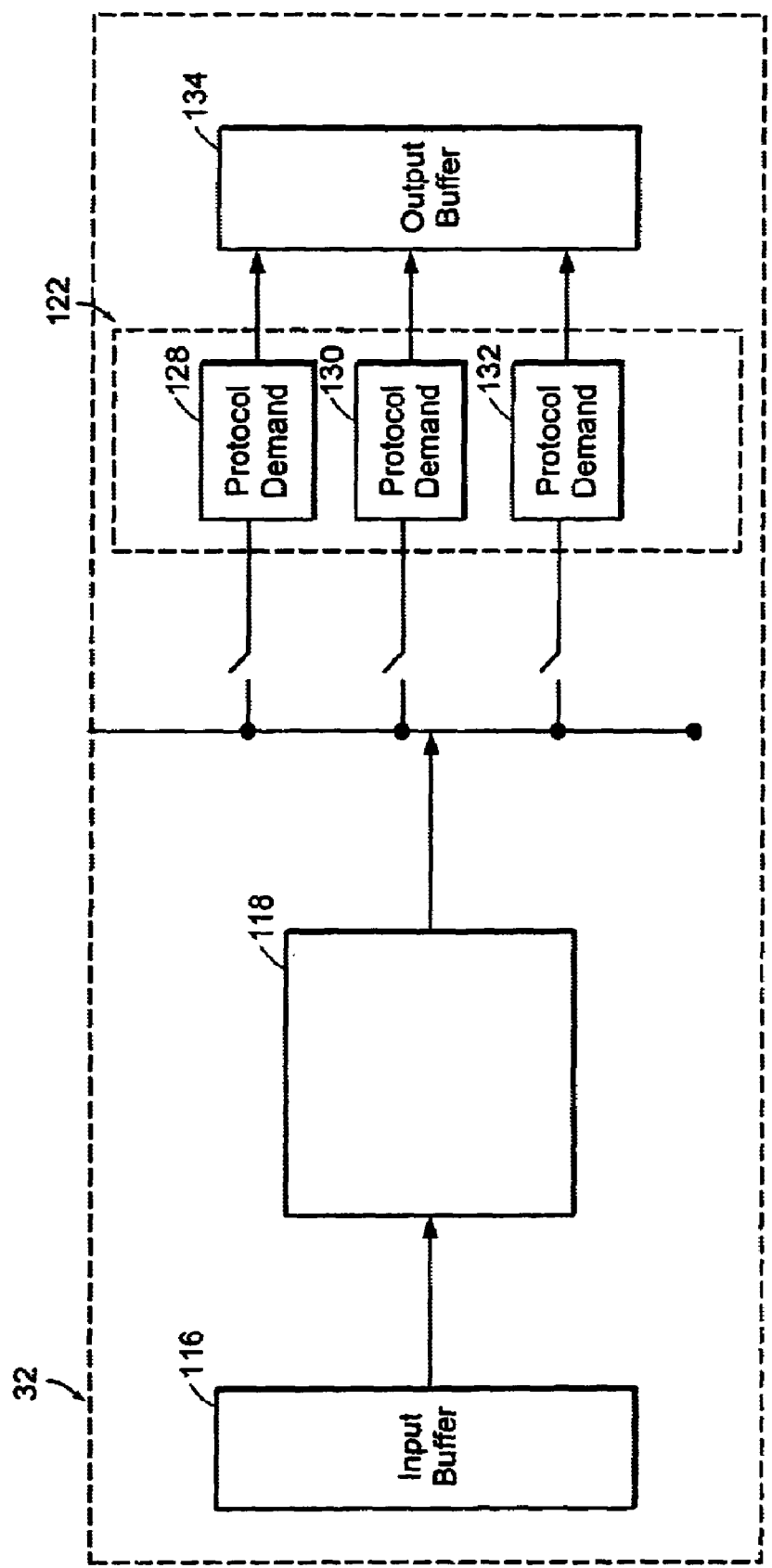
FIGS. 7A and 7B are schematic block diagrams of the demodulator and modulator modules.
Figure 7B:
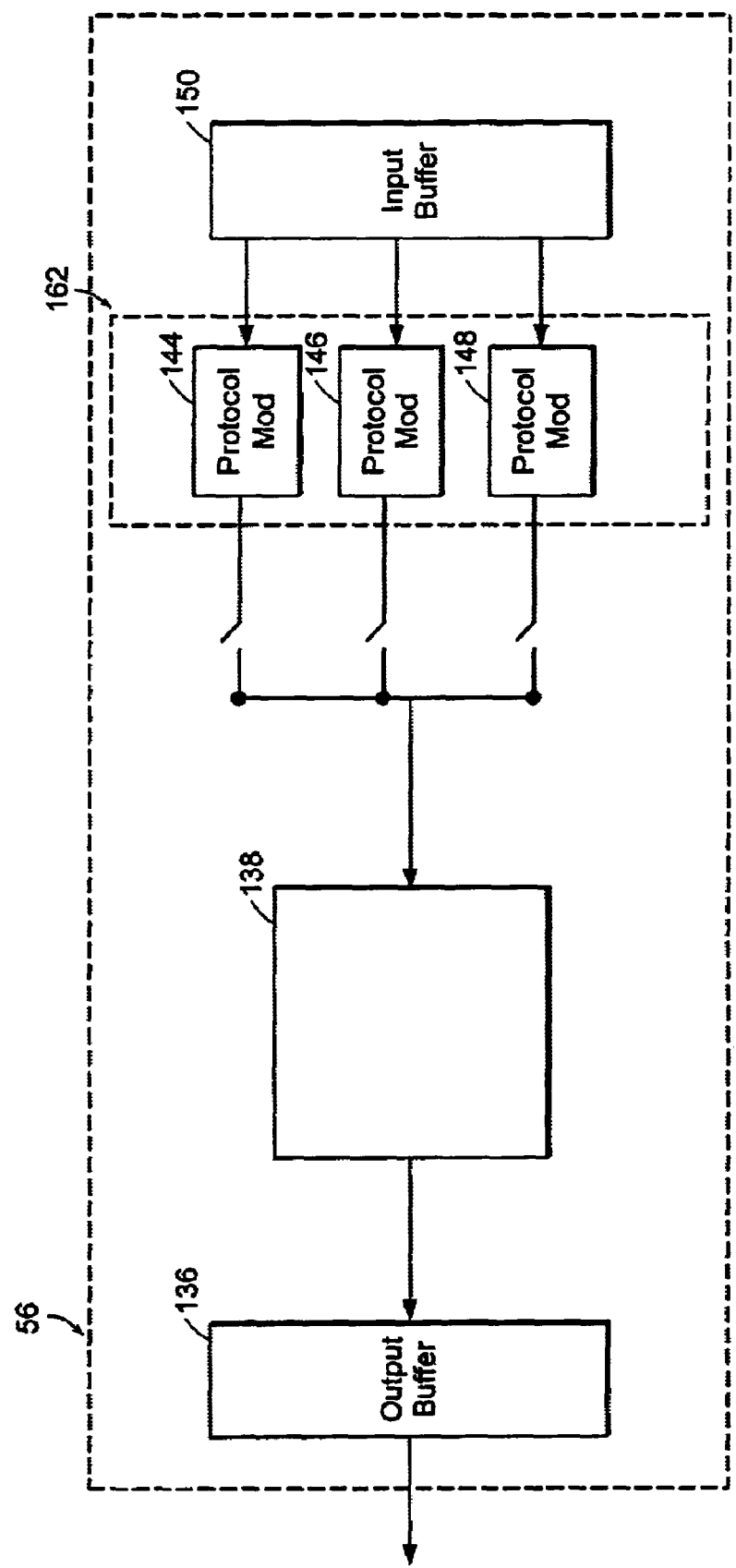

FIGS. 7A and 7B are schematic block diagrams of the demodulator module 32 and modulator module 56. The demodulator module 32 as shown in FIG. 7A includes an input buffer 116, a demodulator multipath channelizer 118, a demodulating circuit 126, and output buffer 134. The input buffer 116 is used to store a variable programmable number of input words from an ADC corresponding to a desire number of time samples. The demodulator multipath channelizer 118 emulates a number of channelizing paths that are used to process the values stored in this input module 116 and derive time multiplexed lower-data-rate outputs for each channel of interest which is being received simultaneously, since the front-end 1 can be operated with multiple users/channels. Varying data rates correspond to varying speed requirements and power consumptions. The number of channelizing paths can be hardwired to the front-end 1 or a combination of the two approaches can be used in this embodiment.

Each channel is then sent to a demodulating circuit 126 which has the programmable coefficients 126, 130, and 132 to demodulate data according to a defined protocol. The output buffer 134 receives the output from the demodulating 126 stores it for later use by the CPU and memory segment 78. A bypass path is used to circumvent any front-end demodulation to allow for transport of the output from the multipath channelizer directly to CPU and memory segment 78 in a "true software radio" case.

A buffer can be inserted in between the multipath channelizer 118 and demodulator circuit 126 to compensate for timing mismatches between the two.

In FIG. 7B, the modulator module 56 includes an input buffer 150, a modulator circuit 152, and a modulator multipath channelizer 138, and an output buffer 136. The input buffer 150 is used to store a variable programmable number of input words from the CPU and memory segment 78 corresponding to a desire number of samples for modulating. The input words are provided to the modulator circuit 142, which has programmable coefficients 144, 146, and 148, to modulate data according to a defined protocol. The modulator circuit outputs are assigned a channel and sent to the demodulator multipath channelizer module 138. The modulator multipath channelizer 138 emulates a number of channelizing paths that are used to process the values received from the modulator circuit 142 and demultiplexed the outputs of each channel which is being received simultaneously. A bypass path is provided such data from the CPU and memory segment 78 is directly provided to the channelizer 138 as in a "true radio case."

Although the present invention has been shown and described with respect to several preferred embodiments thereof, various changes, omissions and additions to the form and detail thereof, may be made therein, without departing from the spirit and scope of the invention.

What is claimed is:

1. A front-end used for processing communication signals in a received path, comprising:
   an antenna cable segment that receives said communication signals;
   a RF segment that provides mixing and filtering of said received signals, said RF segment outputting a first set of signals; and
   an analog baseband segment that performs low pass filtering and digitizes said first set of signals in order to input a second set of signals for further processing, said analog baseband segment comprising at least one analog to digital converter core; wherein
   said RF segment and said analog baseband segment includes a selective set of components that are power programmable, such that the power consumption of said selective set of components is scaled commensurate with bandwidth being utilized and controlled by bias current delivered to each of said selective components;
   said at least one analog to digital converter core includes a reconfigurable block including one or more of said analog to digital converter cores, wherein each of said one or more analog to digital converter cores receiving an analog input signal and outputting a digitize signal, each of said one or more analog to digital converter cores also include a plurality of stages for performing analog to digital conversion;
   said reconfigurable block being configured to switch off and on a selective number of said stages to manage the power consumption of said one or more analog to digital converter cores.

2. The front-end as recited in claim 1, wherein said RF segment includes at least one mixer.

3. The front-end as recited in claim 2, wherein said at least one mixer is power programmable, such that the power consumption of said at least one mixer power is controlled by bias currents.

4. The front-end as recited in claim 1, wherein said RF segment includes a low noise amplifier.

5. The front-end as recited in claim 4, wherein said low noise amplifier is power programmable, such that the power consumption of said low noise amplifier power is controlled by bias currents.

6. The front-end as recited in claim 1, wherein said at least one analog to digital converter is power programmable, such that the power consumption of said at least one analog to digital converter is controlled by bias currents.

7. The front-end as recited in claim 1, wherein said analog baseband segment includes at least one low pass filter.

8. The front-end as recited in claim 7, wherein said at least one low pass filter is power programmable, such that the power consumption of said at least one low pass filter is controlled by bias currents.

9. A front-end used for processing communication signals in a transmit path, comprising:
   an analog baseband that receives modulated signals and performs digital to analog conversion and low pass filtering of said modulated signals, said analog baseband outputting a first set of signals and comprising at least one analog to digital converter core;
   an RF segment that performs mixing and power amplification of said first set of signals, said RF outputting a second set of signals; and
   an antenna cable segment that organizes said second set of signals for transmission; wherein
   said RF segment and said analog baseband segment includes a selective set of components that are power programmable, such that the power consumption of said selective set of is scaled commensurate with bandwidth being utilized utilized and controlled by bias current delivered to each of said selective components;
   said at least one analog to digital converter core includes a reconfigurable block including one or more of said analog to digital converter cores, wherein each of said one or more analog to digital converter cores receiving an analog input signal and outputting a digitize signal, each of said one or more analog to digital converter cores also include a plurality of stages for performing analog to digital conversion;
   said reconfigurable block being configured to switch off and on a selective number of said stages to manage the power consumption of said one or more analog to digital converter cores.

10. The front-end as recited in claim 9, wherein power consumption of said selective set of components is controlled by bias current delivered to each of said selective components.

11. The front-end as recited in claim 1, said at least one digital to analog converter is power programmable, such that the power consumption of said at least one digital to analog converter is controlled by bias currents.

12. The front-end as recited in claim 10, wherein said analog baseband segment includes at least one low pass filter.

13. The front-end as recited in claim 12, wherein said at least one low pass filter is power programmable, such that the power consumption of said at least one low pass filter is controlled by bias currents.

14. The front-end as recited in claim 10, wherein said RF segment includes at least one mixer.

15. The front-end as recited in claim 14, wherein said at least one mixer is power programmable, such that the power consumption of said at least one mixer is controlled by bias currents.

16. The front-end as recited in claim 10, wherein said RF segment includes a pre-amplifier.

17. The front-end as recited in claim 15, said pre-amplifier is power programmable, such that the power consumption of said pre-amplifier is controlled by bias currents.

18. The front-end as recited in claim 10, wherein said RF segment includes a power amplifier.

19. The front-end as recited in claim 18, said power amplifier is power programmable, such that the power consumption of said power amplifier power consumptions is controlled by bias currents.

20. The front-end of claim 1, wherein said one or more analog to digital converter cores are switched off selectively at the coarsest level.

21. The front-end of claim 1, wherein said one or more analog to digital converter cores are based on a switched capacitor pipeline implementation.

22. The front-end of claim 1 further comprising a sample and hold device providing input signals to said reconfigurable block.

23. The front-end of claim 22 further comprising a bypass circuit to drive said analog to digital converter.

24. The front-end of claim 1, wherein said one or more analog to digital converter cores include stages for performing the analog to digital conversion.

25. The front-end of claim 1, wherein said one or more analog to digital converter cores are interleaved.

26. The front-end of claim 9, wherein said one or more digital to analog cores is switched off selectively at the coarsest level.

27. The front-end of claim 9, wherein said digital to analog converter cores are based on a switched capacitor pipeline implementation.

28. The front-end of claim 9 further comprising an amplifier block filtering an processing signals received from said digital to analog converter.

29. The front-end of claim 9, wherein said one or more digital to analog converter cores are interleaved.

30. The front-end of claim 9 further comprising a high amplifier block receiving the output of said one or more digital to analog converter cores and providing dynamic maximum linearity.

* * * * *